(12) United States Patent
Lee et al.

(10) Patent No.: US 11,488,834 B2
(45) Date of Patent: Nov. 1, 2022

(54) METHOD FOR FORMING SILICON OR SILICON COMPOUND PATTERN IN SEMICONDUCTOR MANUFACTURING PROCESS

(71) Applicant: YOUNG CHANG CHEMICAL CO., LTD, Gyeongsangbuk-do (KR)

(72) Inventors: Su Jin Lee, Daegu (KR); Gi Hong Kim, Daegu (KR); Seung Hun Lee, Daegu (KR); Seung Hyun Lee, Daegu (KR)

(73) Assignee: YOUNG CHANG CHEMICAL CO., LTD, Seongju-Gun Gyeongsangbuk-Do (KR)

( * ) Notice: Subject to any disclaimer, the term of this patent is extended or adjusted under 35 U.S.C. 154(b) by 0 days.

(21) Appl. No.: 17/423,334

(22) PCT Filed: Jan. 17, 2020

(86) PCT No.: PCT/KR2020/000841
§ 371 (c)(1),
(2) Date: Jul. 15, 2021

(87) PCT Pub. No.: WO2020/162667
PCT Pub. Date: Aug. 13, 2020

(65) Prior Publication Data
US 2022/0102158 A1    Mar. 31, 2022

(30) Foreign Application Priority Data

Feb. 8, 2019 (KR) .......................... 10-2019-0014849

(51) Int. Cl.
*H01L 21/311* (2006.01)
*H01L 21/02* (2006.01)
*H01L 21/027* (2006.01)

(52) U.S. Cl.
CPC .. *H01L 21/31116* (2013.01); *H01L 21/02052* (2013.01); *H01L 21/0274* (2013.01); *H01L 21/31144* (2013.01)

(58) Field of Classification Search
None
See application file for complete search history.

(56) References Cited

U.S. PATENT DOCUMENTS

| 6,864,556 B1 | 3/2005 | You et al. |
| 2005/0056835 A1* | 3/2005 | Yin .................. H01L 21/02274 257/E21.27 |

FOREIGN PATENT DOCUMENTS

| JP | 2016-216367 A | 12/2016 |
| KR | 10-2007-0036201 A | 4/2007 |
| KR | 10-0766755 B1 | 10/2007 |
| KR | 10-2012-0117678 A | 10/2012 |
| KR | 10-2029127 B1 | 10/2019 |

* cited by examiner

*Primary Examiner* — Roberts P Culbert
(74) *Attorney, Agent, or Firm* — Novick, Kim & Lee PLLC; Jae Youn Kim

(57) ABSTRACT

Disclosed is a method of forming a fine silicon pattern with a high aspect ratio for fabrication of a semiconductor device. The method includes a cleaning process of removing organic residue or reside originating in fumes using a cleaning solution, thereby enabling formation of a desired pattern while preventing the pattern from being lifted. Thus, the present disclosure enables formation of a fine pattern by using a novel cleaning method.

12 Claims, No Drawings

METHOD FOR FORMING SILICON OR SILICON COMPOUND PATTERN IN SEMICONDUCTOR MANUFACTURING PROCESS

TECHNICAL FIELD

The present invention relates to a novel method of forming a silicon pattern or a silicon compound pattern for fabrication of a semiconductor device, the method being used in a process of forming a fine pattern from an organic carbon film, the method including a step of removing foreign matter generated while a polymer is dry etched, thereby preventing a formed pattern from being lifted.

BACKGROUND ART

In recent years, semiconductor devices have been dramatically miniaturized and highly integrated. To deal with such a trend, the implementation of fine patterns is required. An effective approach to achieve the goal is to form thinner photoresist patterns through development of advanced lithography systems or new process technology.

In semiconductor device manufacturing processes, in the past, an i-line (365-nm wavelength) light source was used to form patterns on a semiconductor substrate. However, a smaller wavelength light source was required to form a finer pattern.

In the present, lithography techniques using a KrF (248 nm), ArF (198 nm), or extreme ultraviolet (EUV, 13.5 nm) light source, and even an ArF double exposure lithography technique (also called double patterning lithography) are already commercially available or are about to be put into practical use. With these techniques, finer patterns can be implemented.

When using a traditional thick (>500 nm) photoresist film to implement a fine pattern with a large aspect ratio, the formed pattern will collapse due to an increased aspect ratio. This will serve as an obstruction to the implementation of a fine pattern having a high aspect ratio. When the thickness of the photoresist film is reduced to prevent the pattern collapse, the photoresist film cannot satisfactorily function as a mask during a subsequent dry etching process. In this case, it is difficult to form a pattern having a desired depth.

To solve this problem, an organic carbon layer such as an amorphous carbon layer (AL) is used, or a hard mask such as a spin-on-carbon (SOC) mask or a spin-on-hard mask (SOH) is used in etching processes.

An etching target, which is a film to be etched, is formed first, and then selective dry etching using plasma is performed.

In a brief overview of the process sequence, an SOC layer, which is an organic carbon film, is formed through a coating method on a silicon oxide substrate layer, an SiON layer, which is an inorganic film, is deposited by a chemical vapor deposition method, and a photoresist layer is formed thereon through a coating method and patterned through exposure and development. The SiON layer is then etched by halogen plasma with the resulting photoresist pattern thereon serving as an etching mask, the organic carbon layer is subsequently etched by oxygen plasma, and the oxide layer (substrate layer) is then etched by halogen plasma. After the oxide layer (referred to as "A" film) is etched with halogen plasma, a polymer or compound layer (referred to as "B" film) is deposited on the resulting oxide pattern through chemical vapor deposition, and the substrate layer is finally etched with halogen plasma.

In processes using a hard mask to form ultra-fine patterns, the aspect ratios of the patterns are increasing with decreasing line widths of the patterns. Therefore, many problems are occurring in using a dry etching process. For example, there is a concern that pattern lifting occurs during the subsequent film formation process due to the presence of polymer residue derived from the organic carbon film or impurities derived from fumes during a dry etching process.

The inventor of the present application has conducted a study on the development of new processes to solve problems occurring in existing processes and, as a result, has found that a wet cleaning process performed after a dry etching process enables fine patterns to be formed.

DISCLOSURE

Technical Problem

An objective of the present invention is to provide a novel method of forming a silicon pattern or a silicon compound pattern for fabrication of a semiconductor device. Specifically, this method is used to form a fine pattern from an organic carbon film, and the method includes a step of removing foreign matter using a novel cleaning solution during a polymer dry etching process, thereby preventing a formed pattern from being lifted.

Technical Solution

The invention of the present application relates to a method of forming a pattern using a cleaning process in which a cleaning solution is used to remove residue that remains after a silicon layer or a silicon compound layer is etched to form a silicon pattern or a silicon compound pattern, thereby preventing the problem of pattern lifting.

Specifically, in a process of etching an oxide layer, a silicon layer, or a silicon compound layer among semiconductor device manufacturing processes, an organic film and an inorganic film are sequentially formed on an etching target to have appropriate thicknesses. More specifically, an organic carbon film containing carbon in a high concentration is first formed on the etching target through a coating process, an SiON layer is formed on the organic carbon film through a chemical vapor deposition (CVD) process, and a photoresist layer is formed on the SiON layer through a coating process and then patterned. The SiON layer is then etched by halogen plasma with the resulting photoresist pattern thereon serving as an etching mask, the organic carbon layer is subsequently etched by oxygen plasma, and the oxide layer being a substrate layer is then etched by halogen plasma. After the oxide layer is etched by halogen plasma, a polymer layer or a predetermined compound layer is deposited on the resulting structure through a chemical deposition process. Next, the substrate layer is etched by halogen plasma, thereby producing a desired pattern.

To implement fine patterns, when forming a pattern through a dry etching process after forming an organic carbon coating film and then depositing an oxide layer, a silicon layer, or a silicon compound layer, there is a problem in that polymer residue or fume impurity remains under a formed pattern during the dry etching process and the residue or impurity lifts an inorganic deposition film.

To solve the problem of lifting an inorganic deposition film, a cleaning process using a new cleaning solution is performed to remove foreign matter that exists under the formed pattern, thereby reliably forming a desired fine pattern.

In this context, the term "organic carbon film" refers to a coating film or a deposition film that can be formed on a wafer through coating or deposition and which has a carbon content of 30% to 100%.

The spin coating thickness of spin-on-carbon (SOC) that can be spin-coated among organic carbon materials is not particularly limited but preferably ranges from 100 to 30,000 Å, and the SOC layer may undergo a baking process at 150° C. to 400° C. for 1 to 5 minutes.

The coating film or the deposition film that can be formed through a chemical or physical deposition process is formed to be 100 to 10,000 Å thick at 0.01 to 10 torr using a plasma deposition apparatus.

The cleaning solution is composed of 1% to 100% by weight of a material capable of washing polymer residue off, 0% to 99% by weight of a solvent, 0% to 3% by weight of a surfactant, and 0% to 10% by weight of an alkali compound.

As the material capable of washing polymer residue off, at least one material selected from among alcohol solvents, amide solvents, ketone solvents, ester solvents, and hydrocarbon solvents may be used.

Any solvent can be used as the polymer residue removing agent if it does not dissolve both an organic carbon film and an inorganic film pattern at the same time, and a solution containing a general organic solvent may be preferably used as the polymer residue removing agent.

The surfactant may be selected from the group consisting of anionic, nonionic, cationic, and amphoteric surfactants, and the selected surfactants may be used solely or in combination.

The alkali compound may be selected from amines and ammonium hydroxides.

The cleaning method using the cleaning solution includes spinning a wafer at a speed of 0 to 1,000 rpm, spraying the cleaning solution at a rate of 1 to 200 mL/s for at least 1 second, and stopping the spraying, and spin-drying the wafer.

The polymer or predetermined compound layer, which can be formed by chemical or physical vapor deposition, may be formed to be 100 to 10,000 Å thick at 0.01 to 10 torr using a plasma deposition apparatus.

Advantageous Effects

The method of forming a fine pattern using a new cleaning method, according to the present invention, is used in a case where a desired pattern is formed through the processes of: forming a first pattern by sequentially forming an organic carbon layer and an SiON layer on a silicon oxide substrate layer and performing a first dry etching process to etch the organic carbon layer and the SiON layer; and forming a second pattern by depositing a polymer layer or predetermined compound layer through chemical vapor deposition and performing a second dry etching process to etch the polymer layer or predetermined compound layer.

When depositing the polymer or predetermined compound layer, the polymer or predetermined compound layer is lifted due to reside of the organic carbon film or fumes generated during the primary dry etching, resulting in defects in a finished target pattern. To solve this problem, a cleaning process is performed after the primary dry etching process to remove the residue that may remain under the formed pattern.

The removal of the residue under the pattern solves the problem of lifting the pattern during the deposition of the polymer or predetermined compound layer, thereby enabling a silicon pattern or a silicon compound pattern with a high aspect ratio to be formed.

BEST MODE

Hereinafter, the present invention will be described in detail.

The present invention features a new cleaning process that is performed, during the manufacture of semiconductor devices, to eliminate the residue of an organic carbon film and the residue caused by fumes, the residue being present underneath a formed pattern. Because of the new cleaning method of the present invention, it is possible to form a desired pattern while preventing the formed pattern from being lifted off.

The fine pattern formation method, according to the present invention, using a new cleaning process includes: forming an organic carbon layer on a substrate; forming a SiON layer on the organic carbon layer through chemical vapor deposition (CVD); forming a photoresist film on the SiON layer through coating; allowing the photoresist film to be exposed to light so that a photoresist pattern serving as a mask is formed; performing a primary dry etching process using the mask, thereby forming a pattern; cleaning the substrate using a cleaning solution; forming a polymer layer or a predetermined compound layer on the resulting structure on the substrate through chemical vapor deposition; and performing a secondary dry etching process to form a desired pattern.

The organic carbon layer has a carbon content of 30% to 100% and may be formed through any method selected from among spin coating, chemical vapor deposition (CVD), or physical vapor deposition (PVD).

The spin coating thickness of spin-on-carbon (SOC) that can be spin-coated among organic carbon materials is not particularly limited but preferably ranges from 100 to 30,000 Å, and the SOC layer may undergo a baking process at 150° C. to 400° C. for 1 to 5 minutes.

The SiON layer, which can be formed by chemical or physical vapor deposition, may be formed to a thickness of 100 to 10,000 Å at 0.01 to 10 torr using plasma deposition equipment.

The cleaning solution is composed of 1% to 100% by weight of a material capable of removing polymer residue, 0% to 99% by weight of a solvent, 0% to 3% by weight of a surfactant, and 0% to 10% by weight of an alkali compound.

As the material for removing polymer residue, at least one material selected from among alcohol solvents, amide solvents, ketone solvents, ester solvents, and hydrocarbon solvents may be used.

Any solvent can be used as the polymer residue removing agent if it does not dissolve both an organic carbon film and an inorganic film pattern at the same time, and a solution containing a general organic solvent may be preferably used as the polymer residue removing agent.

The surfactant may be selected from the group consisting of anionic, nonionic, cationic, and amphoteric surfactants, and the selected surfactants may be used solely or in combination.

The alkali compound may be selected from amines and ammonium hydroxides.

The cleaning method using the cleaning solution includes spinning a wafer at a speed of 0 to 1,000 rpm, spraying the cleaning solution at a rate of 1 to 200 mL/s for at least 1 second, and stopping the spraying, and spin-drying the wafer.

The polymer or predetermined compound layer, which can be formed by chemical or physical vapor deposition, may be formed to be 100 to 10,000 Å thick at 0.01 to 10 torr using a plasma deposition apparatus.

Details of the objectives, technical configurations, and operational effects of the present disclosure will be clearly understood from the following detailed description and the accompanying drawings.

The spin coating thickness of spin-on-carbon (SOC) that can be spin-coated among organic carbon materials is not particularly limited but preferably ranges from 100 to 30,000 Å, and the SOC layer may undergo a baking process at 150° C. to 400° C. for 1 to 5 minutes.

The SiON layer, which can be formed by chemical or physical vapor deposition, may be formed to a thickness of 100 to 10,000 Å at 0.01 to 10 torr using plasma deposition equipment.

Patterning is formed using the formed mask, and primary dry etching is performed using an etching gas capable of etching the deposited layer.

Next, the substrate having undergone primary dry etching is cleaned with the clearing solution.

The cleaning solution is composed of 1% to 100% by weight of a material capable of removing polymer residue, 0% to 99% by weight of a solvent, 0% to 3% by weight of a surfactant, and 0% to 10% by weight of an alkali compound.

The cleaning method using the cleaning solution includes spinning a wafer at a speed of 0 to 1,000 rpm, spraying the cleaning solution at a rate of 1 to 200 mL/s for at least 1 second, and stopping the spraying, and spin-drying the wafer.

Next, a layer of polymer or any compound that can be formed through a chemical or physical deposition method is deposited on the substrate. The polymer layer may be formed to have a thickness of 100 to 10000 Å at 0.01 to 10 torr using plasma in a deposition apparatus.

The deposited layer is dry etched using an etching gas to produce a desired pattern. Next, cleaning is performed using the cleaning solution to prevent the pattern from being lifted off.

Herein above, the preferred method of the invention of the present application has been described in detail.

Herein after, preferable examples of the invention and comparative examples will be described. However, the following examples are preferable embodiments of the invention presented only for illustrative purposes and are not intended to limit the present invention.

MODE FOR INVENTION

Examples 1 to 10 and Comparison Examples 1 to 2

Example 1

On the substrate with the patterned layer, a spin-on-carbon (SOC) layer, which is an organic carbon film, was formed to be 1,000 Å thick and backed at 400° C. for 3 minutes. Next, an SiON layer, which is an inorganic film, was formed to be 300 Å thick by a chemical vapor deposition method. Next, a photoresist film for an KrF light source was formed to be 2,000 Å thick, followed by exposure at 24 mj using a Nikon 204B KrF exposure apparatus, resulting in a photoresist mask having a 200 nm pattern. The deposited film was etched down, using a dry etching method, to the oxide layer, which was a base layer (i.e., substrate), using the formed mask and an etching gas. Next, a cleaning solution composed of 80% of isopropyl alcohol, 17.9% of ethylene glycol, 2% of tetraethylammonium hydroxide, and 0.1% of polyoxyethylene lauryl ester was sprayed onto the base layer (substrate) at a rate shown in Table 1. Next, a polymer layer was formed to be 300 Å thick on the substrate by chemical vapor deposition and dry etched to form a final desired pattern.

Examples 2 to 10

The process was performed in the same manner as in Example 1 to form a desired pattern, except that the amount of the cleaning solution sprayed varied as in Table 1.

Comparative Examples 1 to 2

The process was performed in the same manner as in Example 1 to form a desired pattern, except that the amount of the cleaning solution sprayed varied as in Table 1.

The process was performed in the same manner as in Example 1 to form a desired pattern, except that the cleaning solution was not used.

Characterization

The patterns formed in Examples 1 to 10 and Comparative Examples 1 to 2 were observed to check whether the patterns were lifted or not. The results were represented in values. The values are determined by the criteria shown below.

<Criteria for Evaluation Values>

0: lifting was observed from 100% of the observed patterns.
1: lifting was observed from 90% of the observed patterns.
2: lifting was observed from 80% of the observed patterns.
3: lifting was observed from 70% of the observed patterns.
4: lifting was observed from 60% of the observed patterns.
5: lifting was observed from 50% of the observed patterns.
6: lifting was observed from 40% of the observed patterns.
7: lifting was observed from 30% of the observed patterns.
8: lifting was observed from 20% of the observed patterns.
9: lifting was observed from 10% of the observed patterns.
10: lifting was observed from 0% of the observed patterns.

TABLE 1

|  | Amount of ejection (mL) | Lifting evaluation value |
| --- | --- | --- |
| Example 1 | 20 | 4 |
| Example 2 | 30 | 6 |
| Example 3 | 40 | 8 |
| Example 4 | 50 | 10 |
| Example 5 | 100 | 10 |
| Example 6 | 150 | 10 |
| Example 7 | 200 | 10 |
| Example 8 | 210 | 10 |
| Example 9 | 220 | 10 |
| Example 10 | 300 | 10 |

TABLE 1-continued

|  | Amount of ejection (mL) | Lifting evaluation value |
|---|---|---|
| Comparative Example 1 | — | 0 |
| Comparative Example 2 | 10 | 1 |

As shown in Table 1, first, in Comparative Examples 1 and 2 in which the cleaning solution was sprayed in an amount of 0 to 10 mL, the evaluation values of the patterns ranged from 0 to 1, indicating a poor result.

Second, in Examples 1 to 2 in which the cleaning solution was sprayed in an amount of 2~30 mL, the evaluation values ranged from 4 to 6, indicating a good result.

Third, in Example 3 in which the cleaning solution was sprayed in an amount of 40 mL, the evaluation value was 8, indicating a better result.

Fourth, in Examples 4 to 10 in which the cleaning solution was sprayed in an amount of 50 300 mL, the evaluation values were 10, indicating the best result.

The invention claimed is:

1. A method of forming a silicon pattern or a silicon compound pattern in a process of depositing a polymer layer or a predetermined compound layer in the presence of a silicon oxide pattern under a silicon layer or a silicon compound layer, the method comprising:
   sequentially performing deposition of an organic film and an inorganic film on a silicon oxide pattern, application of a photoresist film, and formation of a photoresist pattern through exposure and development of the photoresist film;
   performing a first dry etching process using an etching gas with the photoresist pattern being served as an etching mask;
   cleaning, using a cleaning solution, a wafer with residue of the organic film remaining thereon to prevent pattern lifting attributable to impurities generated during the etching before deposition of the polymer layer or the predetermined compound layer; and
   performing a second dry etching process to etch the polymer layer or the predetermined compound layer.

2. The method according to claim 1,
   wherein the cleaning comprises: spraying the cleaning solution at a rate of 1 to 200 mL/s for 1 to 200 seconds with the wafer being rotated; stopping the spraying; and spin-drying the wafer.

3. The method according to claim 2,
   wherein in the cleaning, the cleaning solution is sprayed in an amount of 20 to 300 mL.

4. The method according to claim 3,
   wherein in the cleaning, the cleaning solution is sprayed in an amount of 40 to 300 mL.

5. The method according to claim 4,
   wherein in the cleaning, the cleaning solution is sprayed in an amount of 50 to 300 mL.

6. The method according to claim 1,
   wherein the deposition of the organic film and the inorganic film on an etching target is chemically or physically performed.

7. The method according to claim 6,
   wherein the organic film on the etching target has a carbon content of 30% to 100%.

8. The method according to claim 1,
   wherein a light source for the formation of the pattern emits light of a 13.5-nm wavelength, a 198-nm wavelength, a 248-nm wavelength, or a 365-nm wavelength or an e-beam.

9. The method according to claim 1,
   wherein the etching gas used for the dry etching process after the formation of the pattern comprises a gas or a mixture of two or more gases selected from among inert gases such as argon or nitrogen, gases of molecules containing one or more fluorine atoms, and oxygen.

10. The method according to claim 1,
    wherein the cleaning solution comprises 1% to 100% by weight of a material capable of washing polymer residue off, 0% to 99% by weight of a solvent, 0% to 3% by weight of a surfactant, and 0% to 10% by weight of an alkali compound.

11. The method according to claim 10,
    wherein the material capable of washing polymer residue off comprises a solvent or a mixture of two or more solvents selected from among alcohol-based solvents, amide-based solvents, ketonic solvents, ester-based solvents, and carbonated hydrogen-based solvents.

12. The method according to claim 10,
    wherein the alkali compound comprises at least one or a mixture of two or more ones selected from among amines and ammonium hydroxides.

* * * * *